United States Patent
Lin

(10) Patent No.: US 9,735,320 B2
(45) Date of Patent: Aug. 15, 2017

(54) LED PACKAGES AND MANUFACTURING METHOD THEREOF

(71) Applicants: LITE-ON ELECTRONICS (GUANGZHOU) LIMITED, Guangzhou (CN); LITE-ON TECHNOLOGY CORP., Taipei (TW)

(72) Inventor: Chen-Hsiu Lin, Taipei (TW)

(73) Assignees: Lite-On Electronics (Guangzhou) Limited, Guangzhou (CN); Lite-On Technology Corp., Taipei (TW)

(*) Notice: Subject to any disclaimer, the term of this patent is extended or adjusted under 35 U.S.C. 154(b) by 0 days.

(21) Appl. No.: 15/184,194

(22) Filed: Jun. 16, 2016

(65) Prior Publication Data

US 2016/0293802 A1    Oct. 6, 2016

Related U.S. Application Data

(63) Continuation of application No. 14/203,766, filed on Mar. 11, 2014, now Pat. No. 9,397,277.

(30) Foreign Application Priority Data

Mar. 22, 2013  (CN) .......................... 2013 1 0095063

(51) Int. Cl.
*H01L 33/46*    (2010.01)
*H01L 33/60*    (2010.01)
(Continued)

(52) U.S. Cl.
CPC .............. *H01L 33/46* (2013.01); *H01L 21/78* (2013.01); *H01L 24/97* (2013.01); *H01L 25/167* (2013.01); *H01L 33/0095* (2013.01); *H01L 33/36* (2013.01); *H01L 33/38* (2013.01); *H01L 33/486* (2013.01); *H01L 33/502* (2013.01); *H01L 33/52* (2013.01); *H01L 33/54* (2013.01); *H01L 33/60* (2013.01); *H01L 33/62* (2013.01); *H01L 2224/48091* (2013.01);
(Continued)

(58) Field of Classification Search
CPC ......... H01L 33/50; H01L 33/54; H01L 33/52; H01L 33/60; H01L 33/36; H01L 33/38; H01L 33/56; H01L 2924/12041; H01L 21/4867; H01L 21/78; H01L 21/784; H01L 33/46; H01L 33/095; H01L 33/486; H01L 33/502; H01L 33/62
See application file for complete search history.

(56) References Cited

U.S. PATENT DOCUMENTS 7,442,564 B2 *  10/2008  Andrews ................. H01L 33/62
                                                      257/E21.499
8,093,619 B2 *  1/2012   Hayashi ................. H01L 33/486
                                                      257/100
(Continued)

*Primary Examiner* — Michael Trinh
(74) *Attorney, Agent, or Firm* — Rosenberg, Klein & Lee

(57) ABSTRACT

A method of manufacturing LED packages includes the steps of: forming a conductive circuit layer on a substrate; screen printing a wall layer on the conductive circuit layer to form a trellis with a plurality of wall units, so that regions of the conductive circuit layer surrounded by the wall units are exposed; mounting and electrically connecting at least one LED die on the conductive circuit layer within each of the wall units; molding a transparent layer to cover the LED dies; and cutting along the wall units to form a plurality of LED packages.

15 Claims, 13 Drawing Sheets

(51) Int. Cl.
    *H01L 33/52*     (2010.01)
    *H01L 33/36*     (2010.01)
    *H01L 21/78*     (2006.01)
    *H01L 25/16*     (2006.01)
    *H01L 33/00*     (2010.01)
    *H01L 33/48*     (2010.01)
    *H01L 23/00*     (2006.01)
    *H01L 33/38*     (2010.01)
    *H01L 33/50*     (2010.01)
    *H01L 33/54*     (2010.01)
    *H01L 33/62*     (2010.01)

(52) U.S. Cl.
    CPC ............... *H01L 2224/48227* (2013.01); *H01L 2924/12035* (2013.01); *H01L 2924/12041* (2013.01)

(56) References Cited

U.S. PATENT DOCUMENTS

| | | | | |
|---|---|---|---|---|
| 2008/0048203 A1* | 2/2008 | Son | ................. | H01L 33/486 257/98 |
| 2009/0224271 A1* | 9/2009 | Seo | ................. | H01L 33/483 257/98 |
| 2012/0098006 A1* | 4/2012 | Chen | ................. | H01L 33/486 257/98 |
| 2013/0001604 A1* | 1/2013 | Shimonishi | ......... | H01L 25/0753 257/88 |
| 2013/0236996 A1* | 9/2013 | Chen | ................. | H01L 33/60 438/27 |

\* cited by examiner

LED PACKAGES AND MANUFACTURING METHOD THEREOF

CROSS-REFERENCE TO RELATED APPLICATION

This application is being filed as a Continuation Application of U.S. Ser. No. 14/203,766, filed 11 Mar.2014, now U.S. Pat. No. 9,397,277, and also claims priority to Chinese Patent Application No.201310095063.5, filed on Mar. 22, 2013.

BACKGROUND OF THE INVENTION

1. Field of the Invention

This invention relates to a LED package and a manufacturing method thereof, more particularly to a LED package having a reflector and a manufacturing method thereof.

2. Description of the Related Art

Referring to FIG. 1, in addition to forming a plastic reflector on a conventional lead frame by means of an injection molding process so as to increase the reflectivity of a light emitting diode (LED) die, a conventional way to enhance the luminous efficiency of an LED is disclosed in U.S. Pat. No. 7,687,292, which involves mounting LED dies 92 on a substrate 91, followed by forming a fluorescent colloid layer 93 by means of a molding process, and then cutting the fluorescent colloid layer 93 to produce grooves 94, followed by another molding process to form a white silicone wall 95 so as to enhance the reflection effect. Finally, a plurality of LED packages are formed by means of a cutting process. However, multiple molding processes result in a greater wearing of the cutters and a higher cost. In addition, an uneven appearance of the interface between the fluorescent colloid layer 93 and the white silicone wall 95 caused by cutting burrs is likely to be generated due to the cutting processes. This results in an easy invasion of moisture or peeling, arising in a poor product yield.

SUMMARY OF THE INVENTION

Therefore, an object of the present invention is to provide a method of manufacturing LED packages that may alleviate the problem of cutting burrs attributed to cutting a fluorescent colloid layer.

Another object of the present invention is to provide an LED package made by the method of this invention.

Since a wall layer is formed on a substrate by virtue of a screen printing process in the present invention, only a single molding process is required after LED dies are mounted, thereby reducing the number of cutting steps and wearing of cutters, and improving upon the adhesion and peeling problems attributed to cutting burrs in the prior art. Therefore, invasion of moisture may be effectively prevented, and a highly reliable product having superior airtight property may be obtained.

BRIEF DESCRIPTION OF THE DRAWINGS

Other features and advantages of the present invention will become apparent in the following detailed description of the preferred embodiments of this invention, with reference to the accompanying drawings, in which.

DETAILED DESCRIPTION OF THE PREFERRED EMBODIMENTS

Figure 1:
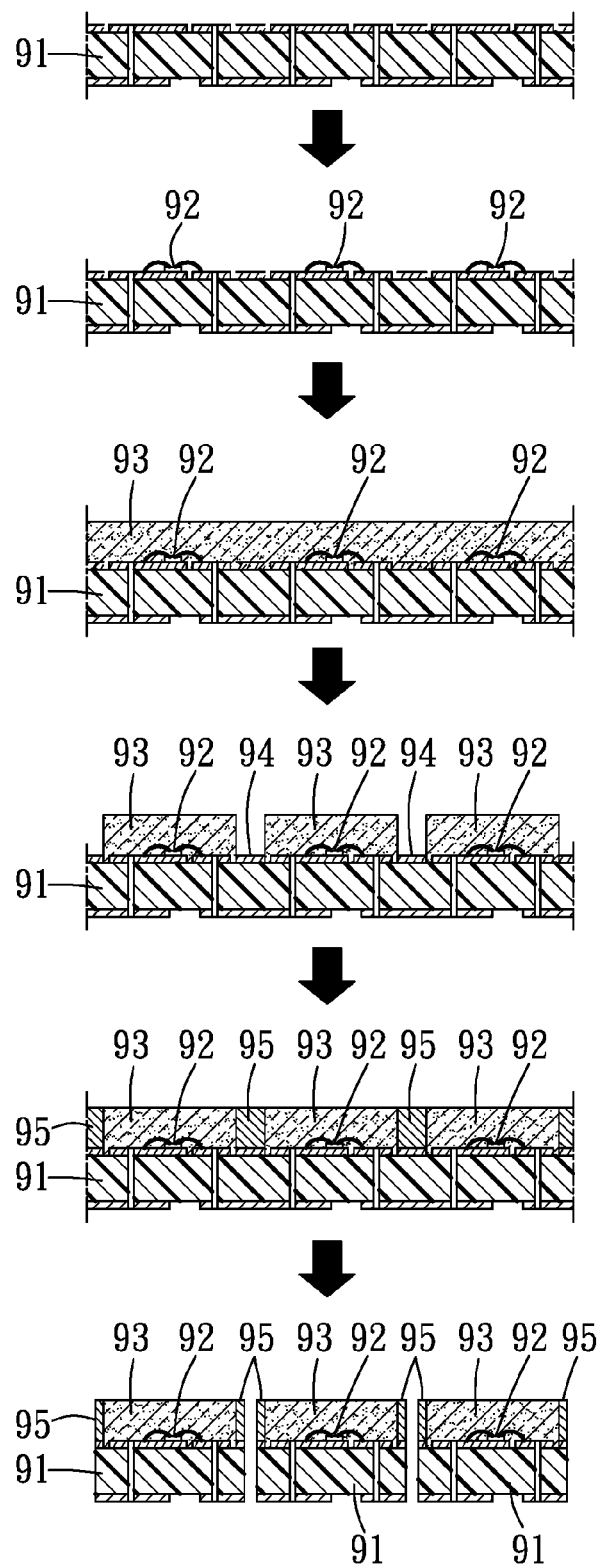
FIG. 1 illustrates consecutive steps of manufacturing LED packages of a conventional method.

Before the present invention is described in greater detail, it should be noted that like components are assigned the same reference numerals throughout the following disclosure.

Figure 2:
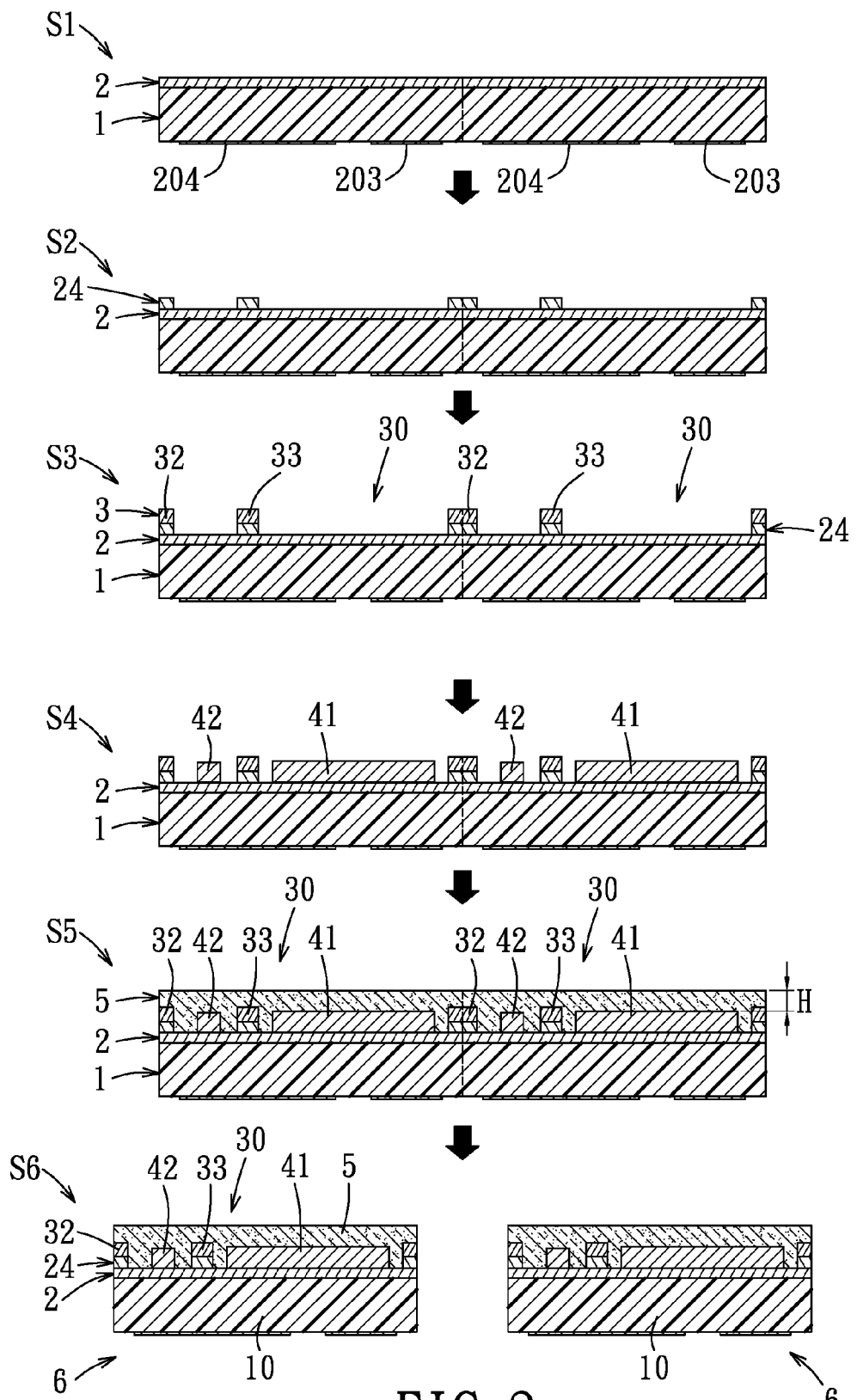
FIG. 2 illustrates consecutive steps of a method of manufacturing LED packages of a first preferred embodiment according to the present invention.
Figure 3:
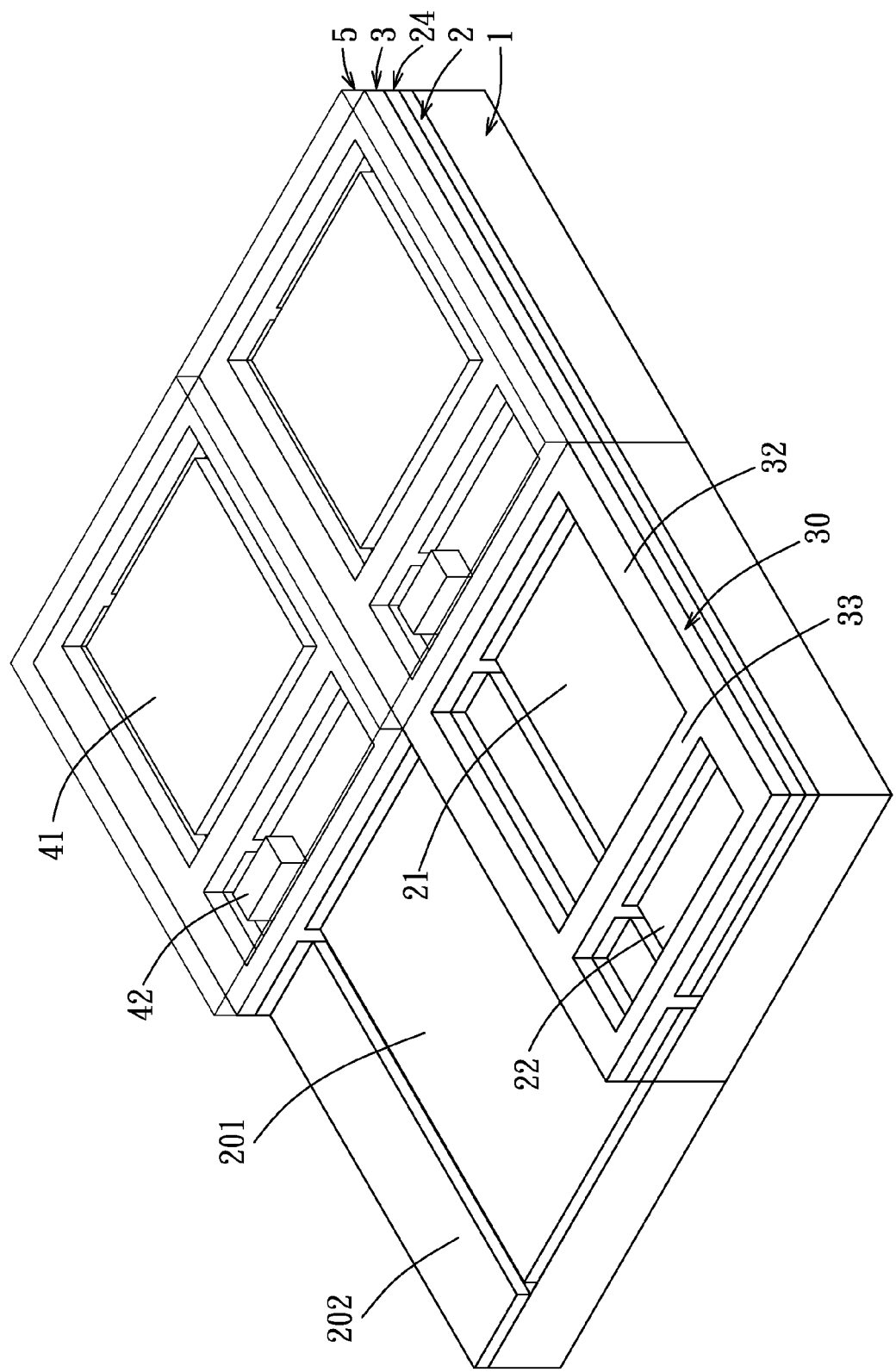
FIG. 3 is a schematic perspective view illustrating a state before a cutting step of the first preferred embodiment.
Figure 4:
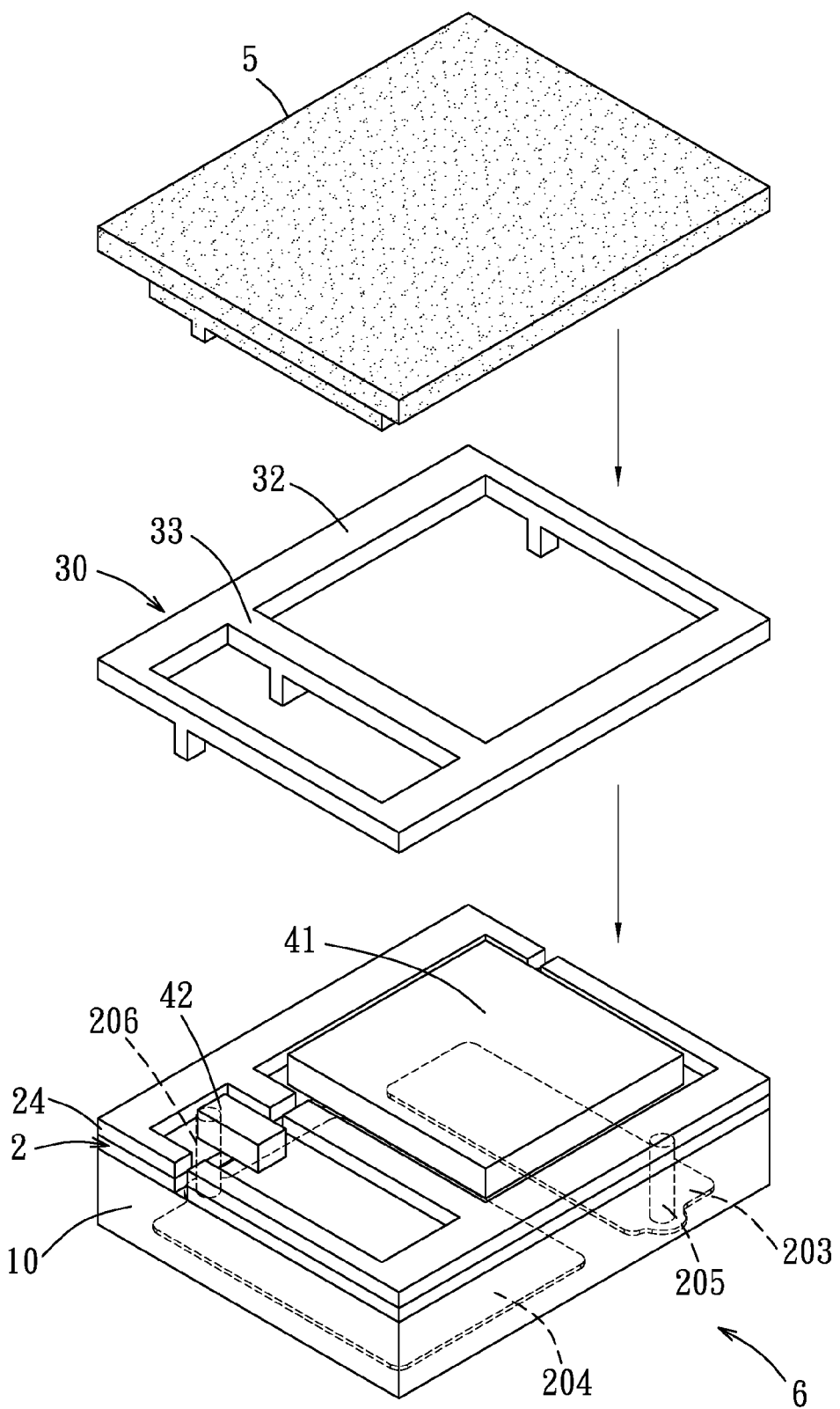
FIG. 4 is a schematic exploded perspective view illustrating an LED package made by the first preferred embodiment.

Referring to FIGS. 2 to 4, a method of manufacturing LED packages of a first preferred embodiment according to the present invention comprises steps S1 to S6.

In step S1, a conductive circuit layer 2 is formed on a substrate 1. In this embodiment, the conductive circuit layer 2 is formed by means of a copper-plating process and is formed such that the upper surface of the substrate 1 is provided with a plurality of positive and negative electrodes 201, 202. A plurality of solder pads 203, 204 are formed on the lower surface of the substrate 1 in the same manner. In addition, a plurality of through holes are provided beforehand at specific positions of the substrate 1. The through holes are filled with copper during the copper-plating process to form a plurality of conductive pillars 205, 206 (only one conductive pillar 205 and one conductive pillar 206 are shown in FIG. 4). The conductive pillars 205, 206 are provided for connecting correspondingly the positive and negative electrodes 201, 202 of the conductive circuit layer 2 to the solder pads 203, 204.

In step S2, a stepped structure 24 is first formed on a region where a wall layer 3 (to be described hereinafter) is to be formed. The stepped structure 24 is similarly formed by means of the copper-plating process on the above mentioned regions of the conductive circuit layer 2, so that the stepped structure 24 projects from the conductive circuit layer 2.

In step S3, an opaque wall layer 3 is formed on the stepped structure 24 by means of a screen printing process, and the wall layer 3 is a trellis so as to form a plurality of wall units 30. Therefore, the regions of the conductive circuit layer 2 respectively surrounded by the wall units 30 are exposed. In this embodiment, each of the wall units 30 has a frame portion 32 and a partition portion 33 so as to define a first mounting area 21 and a second mounting area 22 in each of the regions of the conductive circuit layer 2. The wall layer 3 made of highly reflective white silicone or ink is screen printed on the stepped structure 24. The highly reflective white silicone or ink preferably has a reflectivity of more than 80%. After the screen printing process, the wall layer 3 is then subjected to heat treatment. The wall layer 3 facilitates the reflection of light of LED dies 41 to enhance the light output of the LED package. In this embodiment, the while silicone with a trade name "SWB-4501" is used, and the heat treatment is performed preferably at 150° C. for 2 hours. In other embodiments, a photo-imageable solder resist ink with a trade name "PSR-4000WT03" is used, and the heat treatment is performed preferably at 150° C. for 1 hour. In addition to high reflectivity, non-color changeable property is also a main consideration for selection of the reflective materials. The parameters of heat treatment are dependent on the respective materials, and are not limited to those mentioned above.

In step S4, an LED die 41 is mounted and electrically connected to the first mounting area 21 on the conductive circuit layer 2 within each of the wall units 30, and a Zener diode 42 is mounted and connected electrically to the second mounting area 22. The electrical connections between the LED dies 41 and the positive and negative electrodes 201, 202 of the conductive circuit layer 2 may be established by a direct contact using a flip chip technique or by wires using a wire bonding technique.

In step S5, a transparent colloid layer 5 is formed by means of a molding process so that the transparent colloid layer 5 covers the LED dies 41 and the Zener diodes 42 and is disposed on the conductive circuit layer 2. The transparent colloid layer 5 maybe formed of a transparent resin mixed with a fluorescent powder. Alternatively, the transparent colloid layer 5 maybe only made of a transparent resin, and the surface of the LED dies 41 is covered with a fluorescent powder before the molding process is performed. In other embodiments, the material selection of the transparent colloid layer 5 (e.g. white silicone) can be considered only if the light can be transmitted and invasion of moisture can be isolated. The vertical height H between the top face of the transparent colloid layer 5 and the top face of the LED dies 41 is preferably 150 µm, such that light from the LED dies 41 can be sufficiently light-mixed in the transparent resin mixed with the fluorescent powder. Therefore, an enhanced light-mixing effect can be achieved.

The transparent colloid layer 5 should at least cover the LED dies 41, so that the light from the LED dies 41 is transmitted through the transparent colloid layer 5 and reflected by the wall layer 3 and then exits the transparent colloid layer 5 in a direction away from the substrate 1. In this embodiment, the area corresponding to the whole substrate 1 is covered with the transparent colloid layer 5. That is, not only are the LED dies 41 covered with the transparent colloid layer 5, but the top surface of the wall layer 3 is also covered with the transparent colloid layer 5.

In step S6, by cutting along the frame portions of the wall units 30 to form a plurality of LED packages 6, the substrate 1 is also cut correspondingly to form a plurality of plate members 10. Therefore, the LED packages 6 are only cut during the last process to form individual parts, and no cutting process is performed on the interface of the transparent colloid layer 5 and the wall layer 3. In this way, for example, adhesion and peeling problems attributed to cutting burrs may be avoided. Therefore, invasion of moisture may be effectively prevented, and a highly reliable product with superior airtight property may be obtained.

Referring to FIGS. 3 and 4, an LED package 6 made by the first preferred embodiment comprises a plate member 10, a conductive circuit layer 2, two solder pads 203, 204, two conductive pillars 205, 206, a stepped structure 24, a wall unit 30, a LED die 41, a Zener diode 42, and a transparent colloid layer 5.

The plate member 10 is formed of an insulative material. The conductive circuit layer 2 is formed on the plate member 10 and is formed of an electrically conductive material, and has spaced apart positive and negative electrodes 201, 202 in the form of blocks. The two solder pads 203, 204 are spaced apart from each other and are disposed on the bottom face of the plate member 10. The conductive pillars 205, 206 extend downwardly and respectively from the positive and negative electrodes 201, 202 of the conductive circuit layer 2 through the plate member 10 and are connected respectively to the solder pads 203, 204 so as to electrically connect the positive and negative electrodes 201, 202 to the solder pads 203, 204, respectively. Accordingly, the solder pads 203, 204 can be directly welded to a circuit board (not shown), that is, the positive and negative electrodes 201, 202 can be electrically connected to the circuit board.

The stepped structure 24 is formed between the conductive circuit layer 2 and the wall unit 30, and is formed of a material the same as that of the conductive circuit layer 2, which is copper in this embodiment. The wall unit 30 is made of a highly reflective white silicone or ink, and has a frame portion 32 and a partition portion 33 so as to define a first mounting area 21 and a second mounting area 22 in the conductive circuit layer 2.

The LED die 41 is mounted and electrically connected to the first mounting area 21, and the Zener diode 42 is mounted and electrically connected to the second mounting area 22. In this embodiment, the LED die 41 and the Zener diode 42 are in direct contact with and electrically connected to the positive and negative electrodes 201, 202 by virtue of a flip-chip technique. However, the LED die 41 and the Zener diode 42 may be electrically connected to the positive and negative electrodes 201, 202 by wires using a wire bonding technique in other embodiments of the invention.

The transparent colloid layer 5 may be formed of a transparent resin mixed with a fluorescent powder. The transparent colloid layer 5 covers the wall unit 30 and the region surrounded thereby. Namely, the transparent colloid layer 5 covers the frame portion and the partition portion so as to encapsulate the LED die 41 and the Zener diode 42. The surrounding region includes the LED die 41, the Zener diode 42 and the portions where the conductive circuit layer 2 are exposed. In this way, the light from the LED die 41 is transmitted through the transparent colloid layer 5, reflected by the frame portion 32 and the partition portion 33, and then exits the transparent colloid layer 5 in a direction away from the plate member 10.

In addition, by the configuration of that the top face of the wall unit 30 is higher than the top face of the LED die 41, and the configuration of that the LED die 41 is spaced apart from the frame portion 32 and the partition portion 33, the reflection of the light of the LED die 41 around by the frame portion 32 and the partition 33 can be facilitated. Blocking the Zener diode 42 from the LED die 41 by means of the partition portion 33 may also reduce the light absorption effect of the Zener diode 42. In addition, since the wall unit 30 is formed using a screen printing process, the corners of the wall unit 30 will be round corners rather than right angle (i.e., an angle of 90 degrees) corners.

Figure 5:
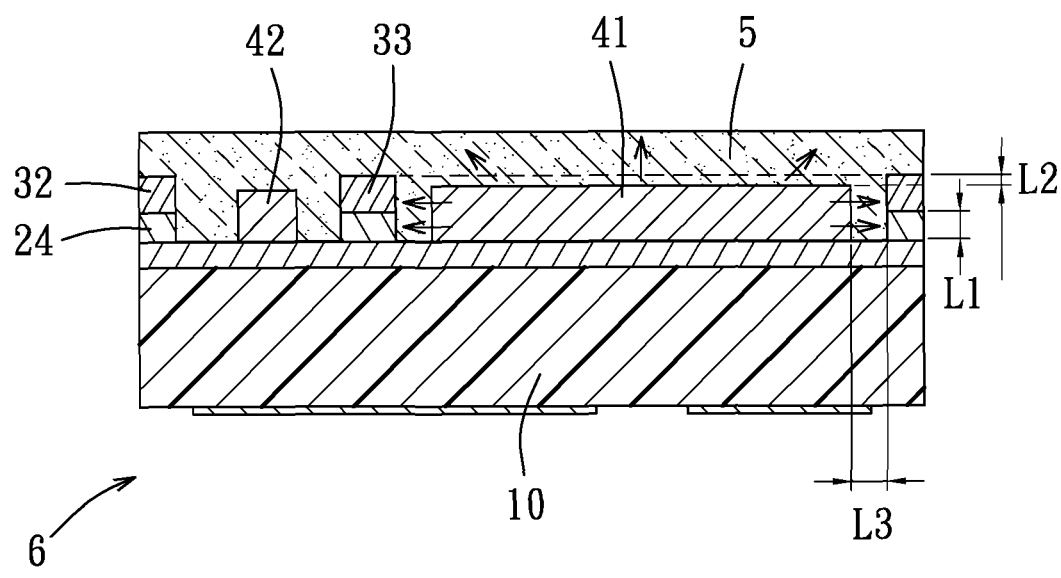
FIG. 5 is a schematic sectional view illustrating the LED package made by the first preferred embodiment.
Figure 6:
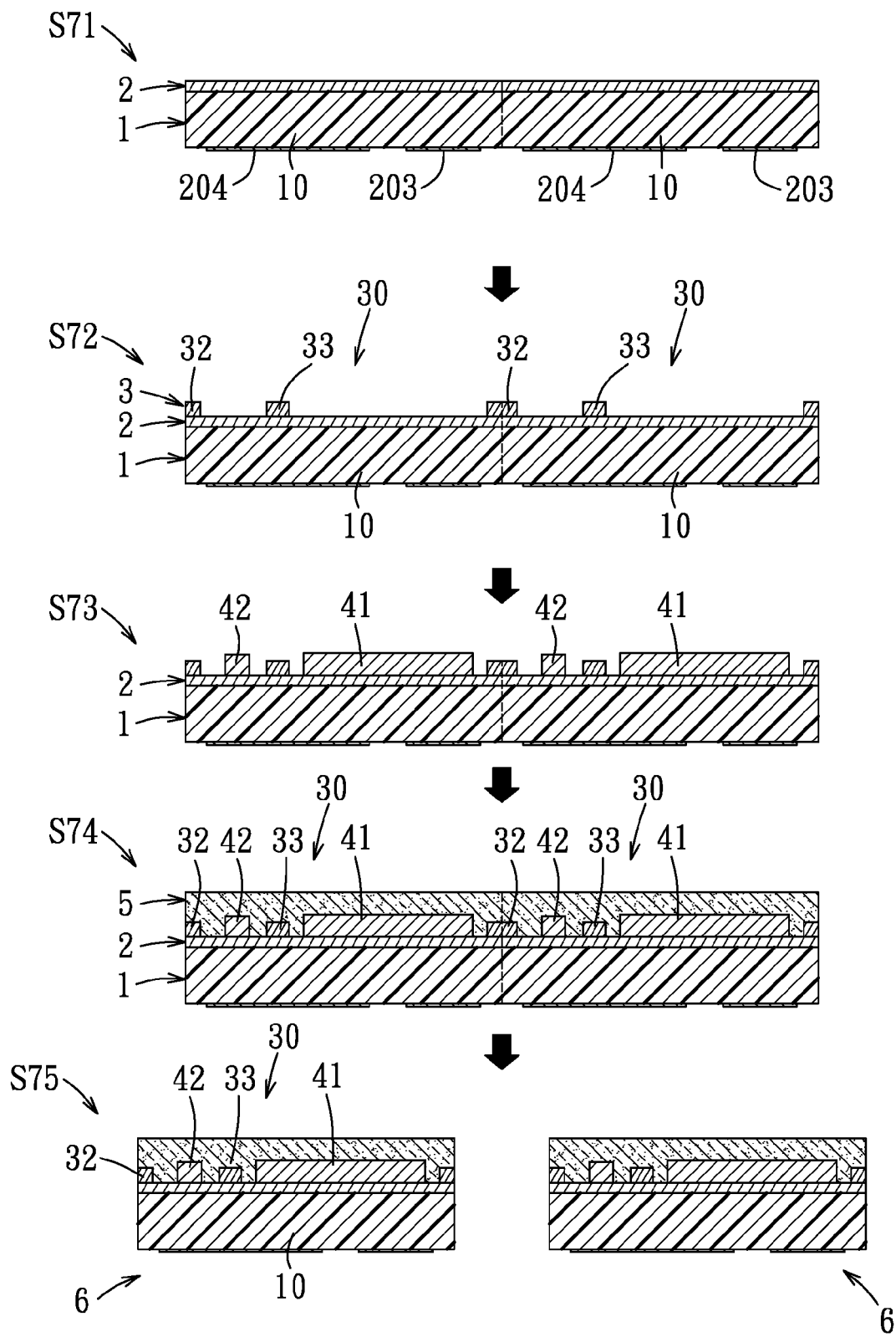
FIG. 6 illustrates consecutive steps of a second preferred embodiment of a method of manufacturing LED packages according to the present invention, in which a stepped structure is omitted.
Figure 7:
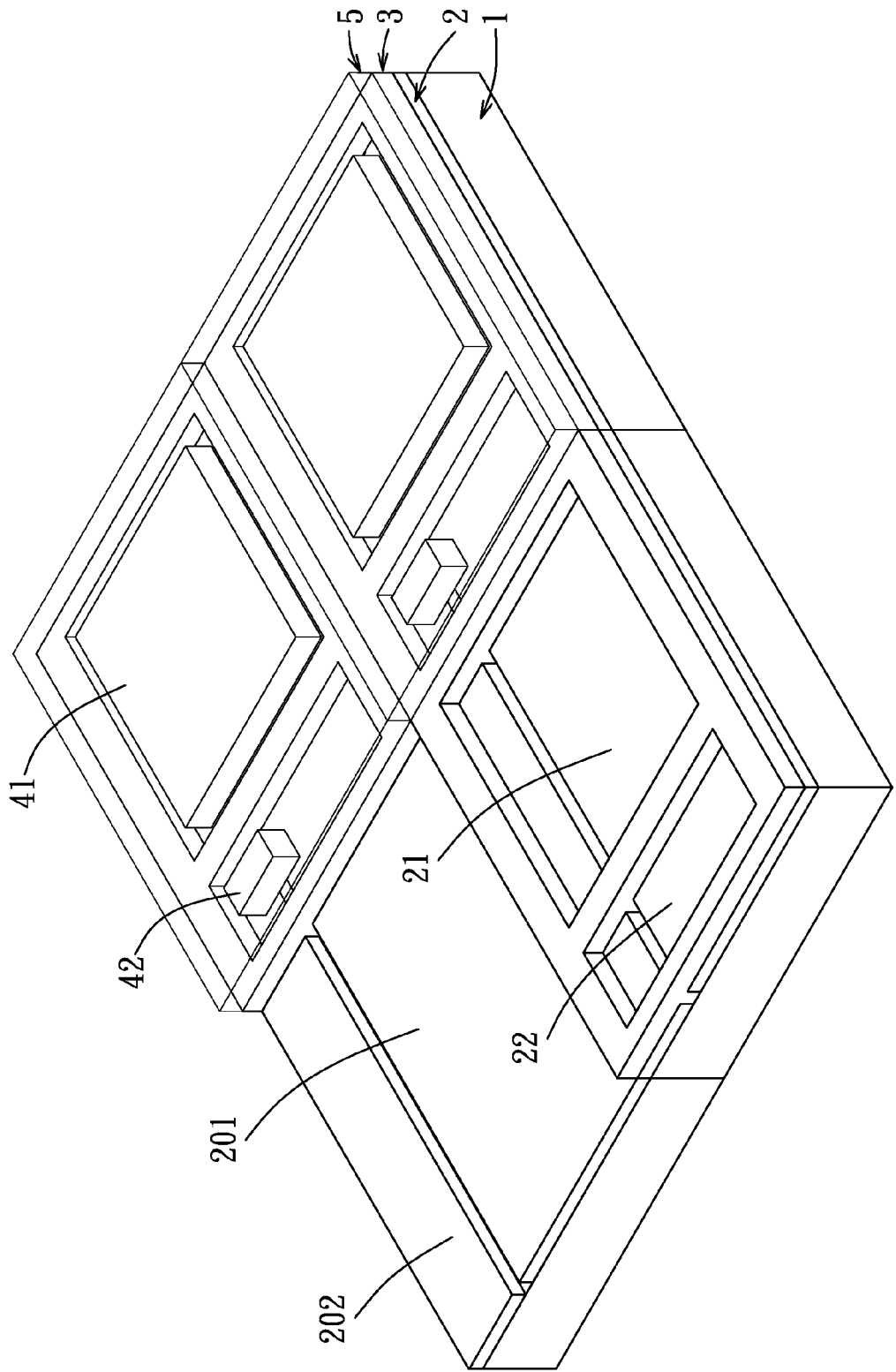
FIG. 7 is a schematic perspective view illustrating a state before a cutting step of the second preferred embodiment.
Figure 8:
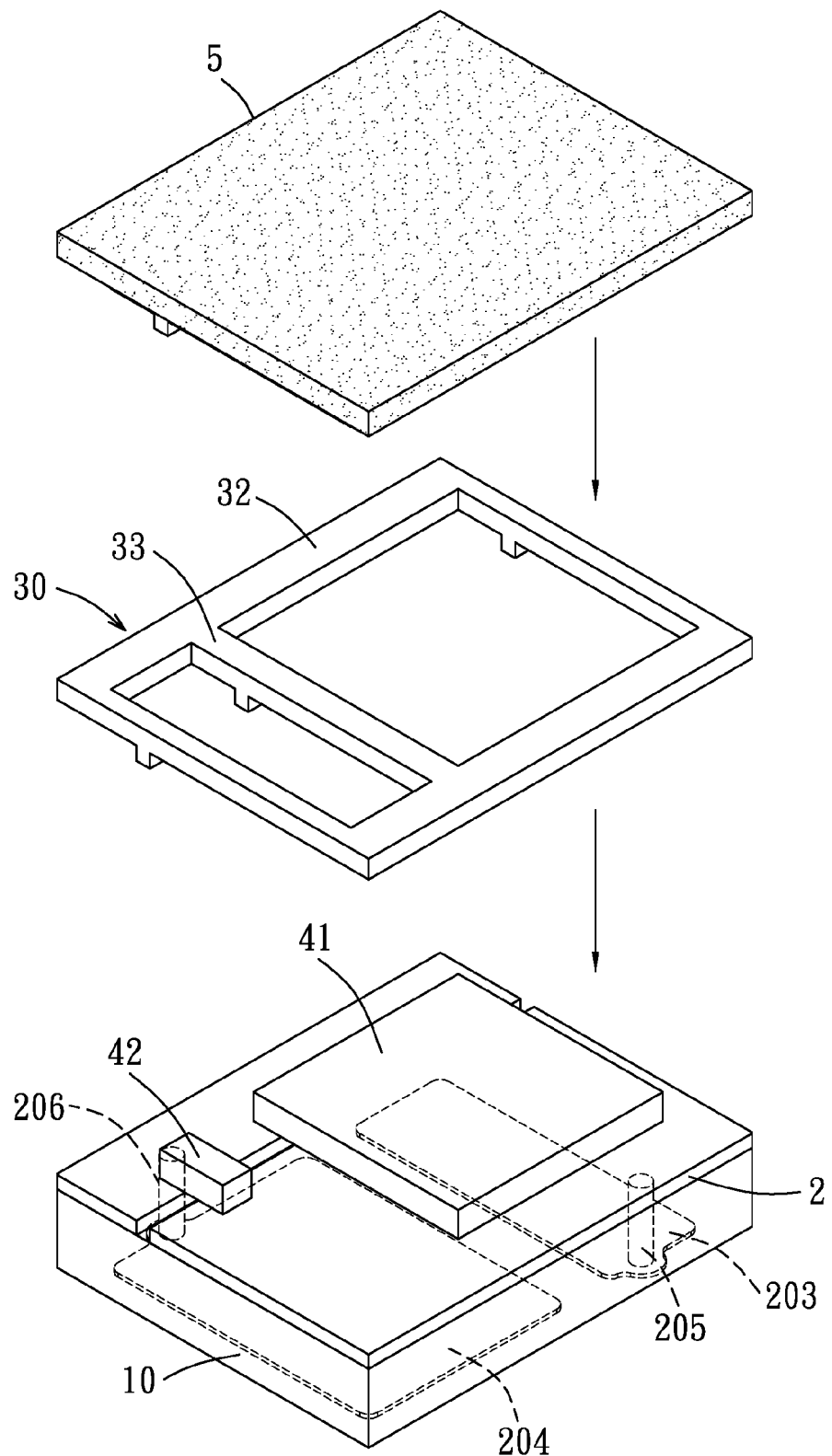
FIG. 8 is a schematic exploded perspective view illustrating an LED package made by the second preferred embodiment.

Referring to FIG. 5, in this embodiment, the height L1 of the stepped structure 24 is about 100 to 200 μm, and the height L2 that is defined by a distance between the top face of the LED die 41 and the top face of the wall unit 30 is about 25 to 100 μm. The height L2 is equal to: (the height L1 of the stepped structure)+(the height of the wall unit)−(the height of the LED die). More particularly, the height of the LED die 41 is larger than the height L1 of the stepped structure 24. The distance L3 between the LED die 41 and the wall unit 30 is about 150 to 500 μm. However, the dimensions L1, L2, L3 may be adjusted as desired, and are not limited to those described herein. In addition, the interface between the wall unit 30 and the stepped structure 24 is preferably positioned at ⅔ of the height of the LED die 41, that is, the height L1 is preferably equal to ⅔ of the height of the LED die 41, so that the LED package 6 has an improved light extraction efficiency. The propagation directions of the light are indicated by the arrows shown in FIG. 5.

Referring to FIGS. 6 to 9, a method of manufacturing LED packages and an LED package 6 made thereby according to a second preferred embodiment of the present invention are shown to be generally similar to the first preferred embodiment, except that the stepped structure 24 (see FIG. 2) is omitted in the second preferred embodiment. That is to say, in view of the steps of the manufacturing method, step S2 (see FIG. 2) is omitted from steps S71 to S75 illustrated in FIG. 6 as compared to the first preferred embodiment. Therefore, the wall layer 3 is formed directly on the conductive circuit layer 2, and a plurality of wall units 30 are formed. As to the LED package 6, in the second preferred embodiment, the wall unit 30 is formed directly on the conductive circuit layer 2 while the transparent colloid layer 5 covers the wall unit 30, the LED die 41, the Zener diode 42 and the portions where the conductive circuit layer 2 are exposed.

Figure 9:
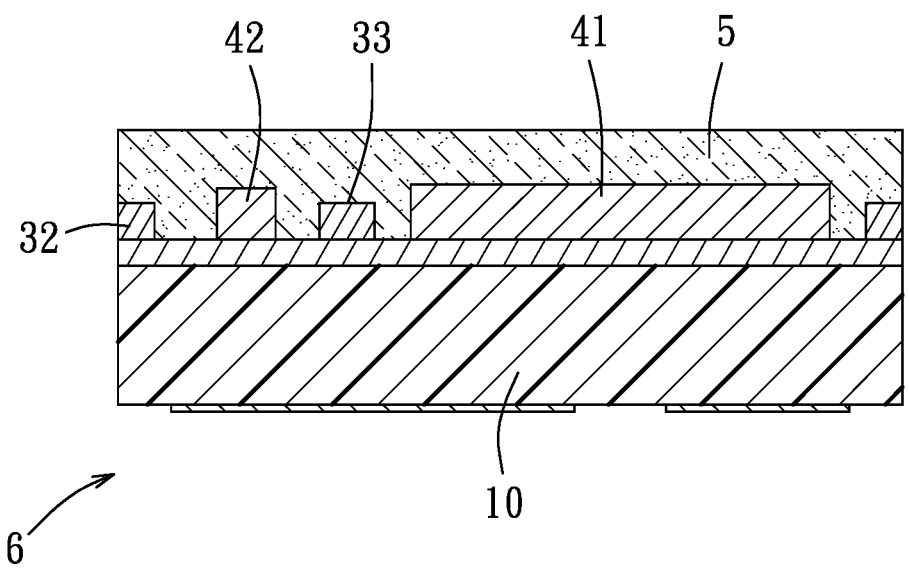
FIG. 9 is a schematic sectional view illustrating the LED package made by the second preferred embodiment.

Under the thickness restriction of a screen printing technique, the total height of the wall unit 30 is lower than the heights of the LED die 41 and the Zener diode 42 in the case in which the stepped structure 24 is not included (as shown in FIG. 9). That is, the top faces of the wall units 30 are lower than the top faces of the LED die 41 and the Zener diode 42. However, in this embodiment, the wall units 30 still have an effect of reflecting the light emitted from the LED die 41.

Figure 10:
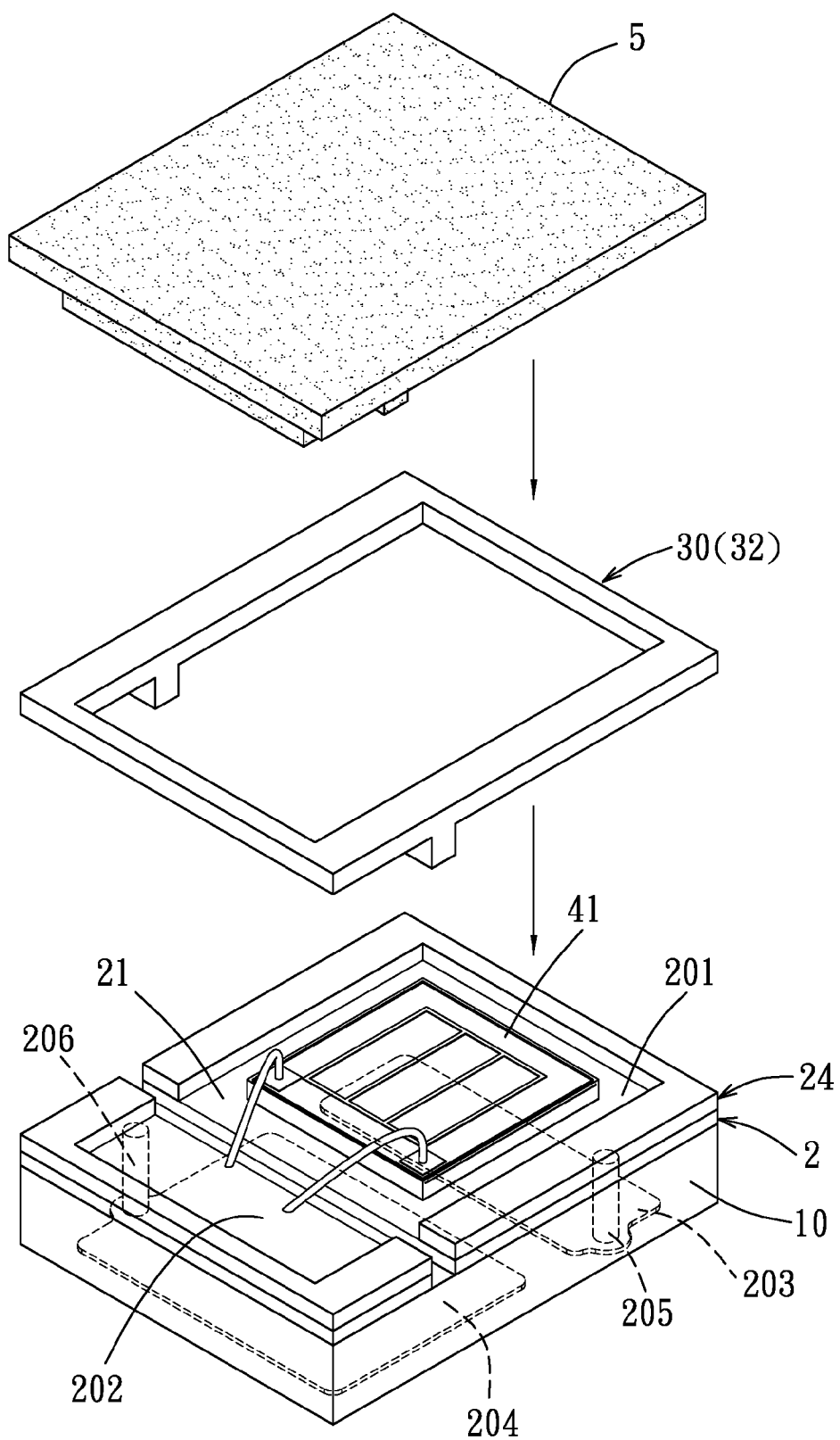
FIGS. 10 to 12 illustrate a method of manufacturing LED packages of a third preferred embodiment according to the present invention, in which a vertical LED die is used.
Figure 11:
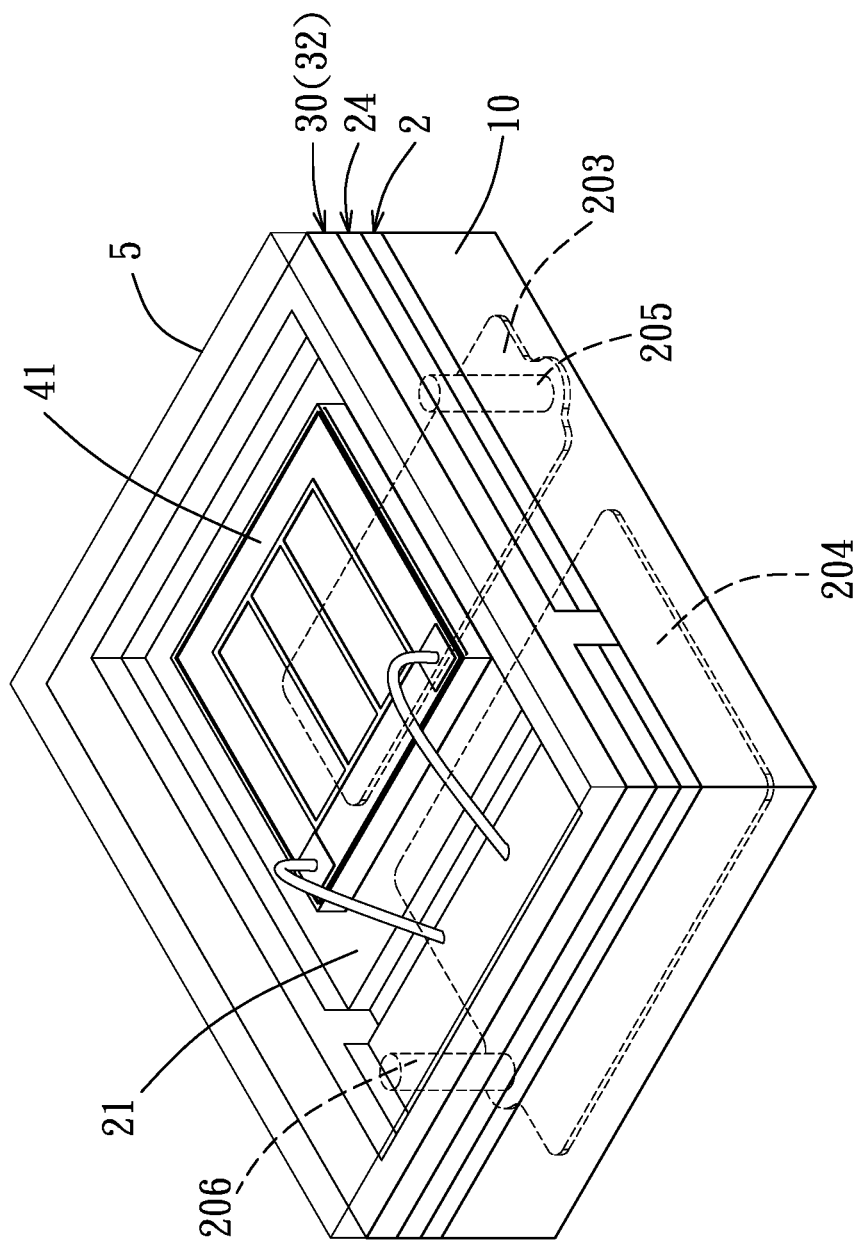

Referring to FIGS. 10 and 11, a method of manufacturing LED packages and an LED package 6 made thereby according to a third preferred embodiment of the present invention are shown to be generally similar to the first preferred embodiment, except that each of the wall units 30 only has an frame portion 32, and does not have a partition portion 33 (see FIG. 4). Therefore, only one first mounting area 21 is defined in the conductive circuit layer 2. In addition, in this embodiment, the Zener diode 42 is omitted. Further, a vertical LED die is used as the LED die 41. The bottom electrode of the vertical LED die is in direct contact with and electrically connected to the positive electrode 201 of the conductive circuit layer 2, and the top electrode of the vertical LED die is electrically connected to the negative electrode 202 by means of a wire bonding technique. Similarly, the positive and negative electrodes 201, 202 are electrically connected to the solder pads 203, 204 through conductive pillars 205, 206, respectively.

Figure 12:
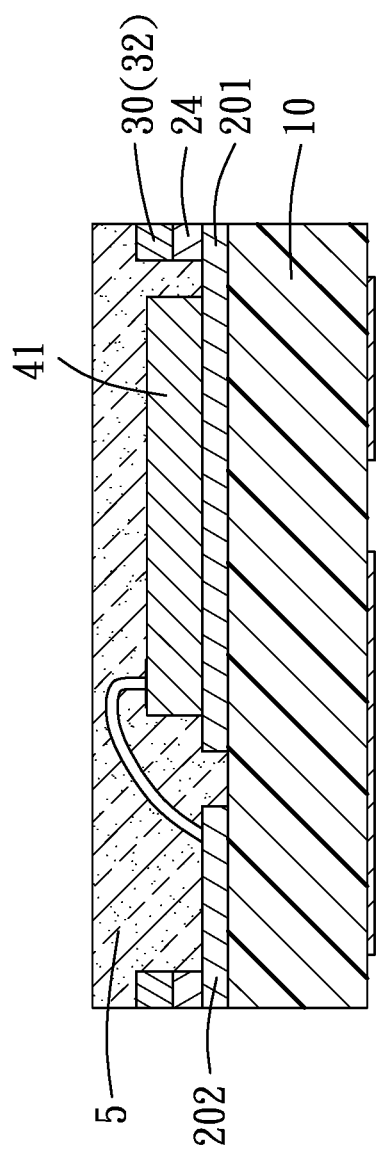

Referring to FIG. 12, it is noted that, in the present invention, since the stepped structure 24 and the wall layer 3 are formed respectively using the electroplating and screen printing processes, the total height of the stepped structure 24 and the wall layer 3 may be lower than the height of the wires. In other words, a total height of the stepped structure 24 and the wall layer 3 is lower than a top point of the wire. Therefore, when the transparent colloid layer 5 is provided using a molding process, the total height of the stepped structure 24, the wall layer 3 and the transparent colloid layer 5 must be larger than the total height of the LED die and the wires in order to prevent exposure of the wires from the LED package.

Figure 13:
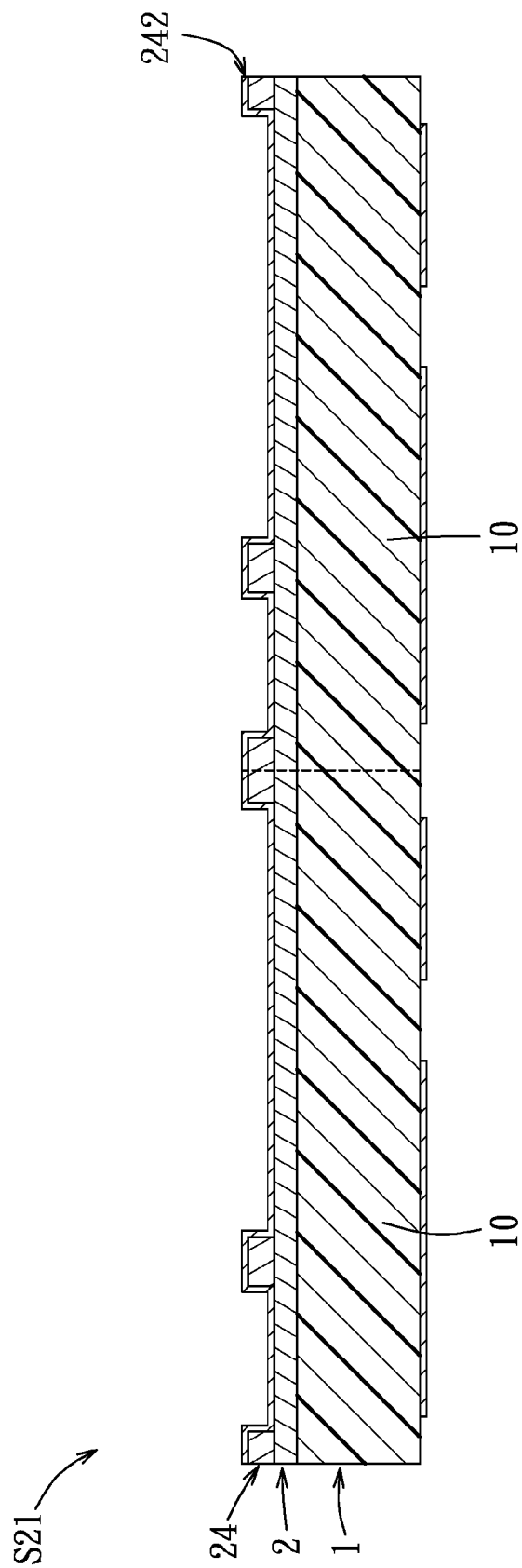
FIG. 13 is a schematic sectional view illustrating a step of forming a highly reflective layer of a method of manufacturing LED packages of a fourth preferred embodiment according to the present invention.

Referring to FIGS. 2 and 13, a method of manufacturing LED packages and an LED package 6 made thereby according to a fourth preferred embodiment of the present invention are shown to be generally similar to the first preferred embodiment, except that after the steps S1, S2 of forming the conductive circuit layer 2 and the stepped structure 24 on the substrate 1, a step S21 is further performed to electroplate a highly reflective layer 242, for example, nickel, silver, etc., on the conductive circuit layer 2 and the stepped structure 24 in order to further facilitate the reflection of the light of the LED die 41. It is also noted that the step S21 may be implemented in combination with the abovementioned embodiments to facilitate the reflection of the light in the respective embodiments.

To sum up, since the highly reflective wall layer 3 is formed on the substrate 1 by virtue of a screen printing process, only a single molding process is required after the LED dies are mounted, thereby reducing the number of the cutting steps and the wearing of the cutters, and improving upon the adhesion and peeling problems attributed to cutting burrs in the prior art. Therefore, invasion of moisture may be effectively prevented, and a highly reliable product having superior airtight property may be obtained.

While the present invention has been described in connection with what are considered the most practical and preferred embodiments, it is understood that this invention is not limited to the disclosed embodiments but is intended to cover various arrangements included within the spirit and scope of the broadest interpretation and equivalent arrangements.

What is claimed is:
1. A LED package, comprising:
   a plate member;
   a conductive circuit layer formed on said plate member;
   a wall unit having a frame portion and a partition portion, said frame portion and said partition portion having a first height and a second height, respectively, said wall unit being formed on said conductive circuit layer, a region of said conductive circuit layer that is surrounded by said wall unit being exposed so as to define said region as a first mounting area and a second mounting area in said conductive circuit layer;
   at least one LED die disposed on said conductive circuit layer in said first mounting area, said LED die being connected to a positive electrode of said conductive circuit layer and a negative electrode of said conductive circuit layer by a flip chip technique and being disposed within said wall unit;
   a Zener diode being connected electrically to said second mounting area of said conductive circuit layer and being disposed within said wall unit;
   a transparent layer disposed on said wall unit with a thickness to encapsulate said LED die and said Zener diode, a plurality of side surfaces of said transparent layer being defined by said thickness of said transparent layer, and said plurality of side surfaces of said transparent layer being flush with said wall unit;

two solder pads formed on a lower surface of said plate member and spaced apart from each other; and two conductive pillars respectively extending through said plate member so as to electrically connect said positive electrode and said negative electrode of said conductive circuit layer to said two solder pads.

2. The LED package as claimed in claim 1, wherein said first height is equal to said second height.

3. The LED package as claimed in claim 1, further comprising a stepped structure that is formed between said conductive circuit layer and said wall unit, and a total height of said stepped structure and said wall unit being greater than the height of said LED die.

4. The LED package as claimed in claim 3, wherein said stepped structure and said conductive circuit layer are formed of a same material.

5. The LED package as claimed in claim 3, wherein surfaces of said stepped structure and said conductive circuit layer are covered with a reflective layer.

6. The LED package as claimed in claim 1, further comprising a stepped structure that is formed between said conductive circuit layer and said wall unit, wherein a total height of said stepped structure and said wall layer is lower than a top point of said wire.

7. The LED package as claimed in claim 1, wherein said wall unit is formed of a reflective material selected from the group consisting of white silicone and ink.

8. The LED package as claimed in claim 1, further comprising a fluorescent material mixed within said transparent layer.

9. The LED package as claimed in claim 1, further comprising a fluorescent material disposed on said LED die.

10. The LED package as claimed in claim 1, wherein a height of said LED die is larger than the height of said wall unit.

11. A LED package, comprising:
a plate member;
a conductive circuit layer formed on said plate member;
a wall unit having a frame portion, said frame portion having a height and being formed on said conductive circuit layer, a region of said conductive circuit layer that is surrounded by said wall unit is exposed so as to define said exposed region as a mounting area in said conductive circuit layer;
at least one LED die disposed on said conductive circuit layer, said LED die being connected electrically to said conductive circuit layer and being disposed within said wall unit and being mounted and electrically connected to said mounting area, wherein said LED die is connected to a positive electrode of said conductive circuit layer and a negative electrode of said conductive circuit layer;
a transparent layer disposed on said wall unit with a thickness to encapsulate said LED die, a plurality of side surfaces of said transparent layer being defined by said thickness, and said plurality of side surfaces of said transparent layer being flush with said wall unit;
two solder pads formed on a lower surface of said plate member and spaced apart from each other; and two conductive pillars respectively extending through said plate member so as to electrically connect said positive electrode and said negative electrode of said conductive circuit layer to said two solder pads.

12. The LED package as claimed in claim 11, further comprising a stepped structure that is formed between said conductive circuit layer and said wall unit, and a total height of said stepped structure and said wall unit being greater than the height of said LED die.

13. The LED package as claimed in claim 11, wherein said conductive circuit layer comprises a positive electrode and a negative electrode, said LED die is disposed on one of said positive electrode and said negative electrode, and a wire is bonded between an electrode of said LED die and the other one of said positive electrode and said negative electrode.

14. A LED package, comprising:
a plate member having an upper surface and a lower surface;
a conductive circuit layer having a positive electrode and a negative electrode and being formed on said upper surface of said plate member;
a wall unit having a frame portion and a partition portion, said frame portion and said partition portion having a first height and a second height, respectively, said wall unit being formed on said positive electrode and said negative electrode of said conductive circuit layer, a region of said conductive circuit layer that is surrounded by said wall unit being exposed so as to divide said region into a first mounting area and a second mounting area in said conductive circuit layer;
at least one LED die disposed on at least one of said positive electrode and said negative electrode of said conductive circuit layer, and mounted and electrically connected to said first mounting area;
a Zener diode disposed on at least one of said positive electrode and said negative electrode of said conductive circuit layer, and mounted and electrically connected to said second mounting area;
a transparent layer disposed on said wall unit with a thickness to encapsulate said LED die and said Zener diode, a plurality of side surfaces of said transparent layer being defined by said thickness of said transparent layer, and said plurality of side surfaces of said transparent layer being flush with said wall unit; two solder pads formed on said lower surface of said plate member and spaced apart from each other; and
two conductive pillars respectively extending through said plate member so as to electrically connect said positive electrode and said negative electrode of said conductive circuit layer to said two solder pads.

15. The LED package as claimed in claim 14, further comprising a stepped structure that is formed between said conductive circuit layer and said wall unit, and a total height of said stepped structure and said wall unit being greater than the height of said LED die.

* * * * *